United States Patent [19]

Parkin

[11] Patent Number: 5,585,986
[45] Date of Patent: Dec. 17, 1996

[54] DIGITAL MAGNETORESISTIVE SENSOR BASED ON THE GIANT MAGNETORESISTANCE EFFECT

[75] Inventor: Stuart S. P. Parkin, San Jose, Calif.

[73] Assignee: International Business Machines Corporation, Armonk, N.Y.

[21] Appl. No.: 441,133

[22] Filed: May 15, 1995

[51] Int. Cl.[6] .............................. G11B 5/127; G11B 5/39; H01L 43/00
[52] U.S. Cl. ......................... 360/113; 428/212; 428/693; 428/213; 428/611; 324/252; 338/32 R
[58] Field of Search .................................. 360/110, 113, 360/126; 324/252; 338/32 R; 428/212, 213, 611, 693

[56] References Cited

U.S. PATENT DOCUMENTS

| 5,134,533 | 7/1992 | Friedrich et al. | 360/113 |
| 5,313,186 | 5/1994 | Schuhl et al. | 360/113 |
| 5,315,282 | 5/1994 | Shinjo et al. | 338/32 R |
| 5,341,118 | 8/1994 | Parkin et al. | 338/32 R |
| 5,343,422 | 8/1994 | Kung et al. | 365/173 |
| 5,366,815 | 11/1994 | Araki et al. | 428/611 |
| 5,432,661 | 7/1995 | Shinjo et al. | 360/113 |

(List continued on next page.)

FOREIGN PATENT DOCUMENTS

WO 95/03604  2/1995  WIPO.

OTHER PUBLICATIONS

G. R. Harp et al., "Seeded Epitaxy of Metals By Sputter Deposition", Applied Physics Letters, vol. 65, No. 24, Dec. 12, 1994, pp. 3063–3065.

K. Inomata et al., "Giant Magnetoresistance and Magnetic Anisotropy in Cog/FeCuCog/Fe Sandwiches on a MgO (110) Substrate", Trans. Inst. Electr. Eng. Jpn. A, vol. 114–A, No. 11, Nov. 1994, pp. 756–760. (No English trans.).

(List continued on next page.)

*Primary Examiner*—Jefferson Evans
*Attorney, Agent, or Firm*—Thomas R. Berthold

[57] ABSTRACT

A magnetoresistive (MR) sensor based on the giant magnetoresistance (GMR) effect provides a digital output signal. The multilayer stack of alternating ferromagnetic layers and nonferromagnetic metal spacer layers in the GMR sensor has an essentially single crystalline structure so that each of the ferromagnetic layers exhibits uniaxial magnetic anisotropy, i.e. the magnetic moments of the ferromagnetic layers can lie only parallel or antiparallel to a single axis. Unlike GMR multilayers where all of the magnetic moments are affected simultaneously by the external magnetic field, in the present GMR sensor each ferromagnetic layer has its magnetic moment responsive to an external magnetic field strength that is different from the magnetic field strengths at which the magnetic moments of the other ferromagnetic layers are responsive. This allows each ferromagnetic layer to switch its magnetization direction from parallel to antiparallel, or vice versa, independently of the other ferromagnetic layers. This unique property of each ferromagnetic layer is accomplished by either selecting each ferromagnetic layer to have a different uniaxial magnetic anisotropy energy, such as by varying the strain during crystalline growth, or by subjecting each ferromagnetic layer to a different value of antiferromagnetic exchange coupling energy, such as by varying the thicknesses of the nonferromagnetic metal spacer layers. As a result, the resistance of the GMR sensor changes in stepped increments as the external magnetic field is varied, thereby providing a digital signal output. The digital GMR sensor can be used as a read head in a multiple data layer magnetic recording data storage system. In one disk drive embodiment, the magnetic recording disk has two magnetically isolated and decoupled magnetic data layers. The digital GMR sensor reads the written data bits from both data layers simultaneously, and it's digital output signal is then decoded by conventional logic circuitry to provide the separate data recorded in each of the data layers.

18 Claims, 10 Drawing Sheets

U.S. PATENT DOCUMENTS

| | | | |
|---|---|---|---|
| 5,442,508 | 8/1995 | Smith | 360/113 |
| 5,447,781 | 9/1995 | Kano et al. | 428/212 |
| 5,452,163 | 9/1995 | Coffey et al. | 360/113 |
| 5,462,795 | 10/1995 | Shinjo et al. | 428/332 |
| 5,474,833 | 12/1995 | Etienne et al. | 428/209 |
| 5,476,680 | 12/1995 | Coffey et al. | 427/130 |
| 5,500,633 | 3/1996 | Saito et al. | 338/32 R |
| 5,508,867 | 4/1996 | Cain et al. | 360/113 |
| 5,510,172 | 4/1996 | Araki et al. | 428/213 |
| 5,514,452 | 5/1996 | Araki et al. | 428/213 |
| 5,514,469 | 5/1996 | Shinjo et al. | 428/332 |
| 5,523,172 | 6/1996 | Saito et al. | 428/611 |

OTHER PUBLICATIONS

K. Inomata et al., "Magnetic and Magnetoresistance Properties in $Ni_{80}Fe_{20}$/Cu Multilayers with In–plane Uniaxial Magnetic Anisotropy", Journal of Applied Physics, vol. 74, No. 6, Sep. 15, 1993, pp. 4096–4101.

Parkin, "Systematic Variation of the Strength and Oscillation Period of Indirect Magnetic Exchange Coupling Through the 3d, 4d, and 5d Transition Metals", Physical Review Letters, vol. 67, No. 25, Dec. 16, 1991, pp. 3598–3601.

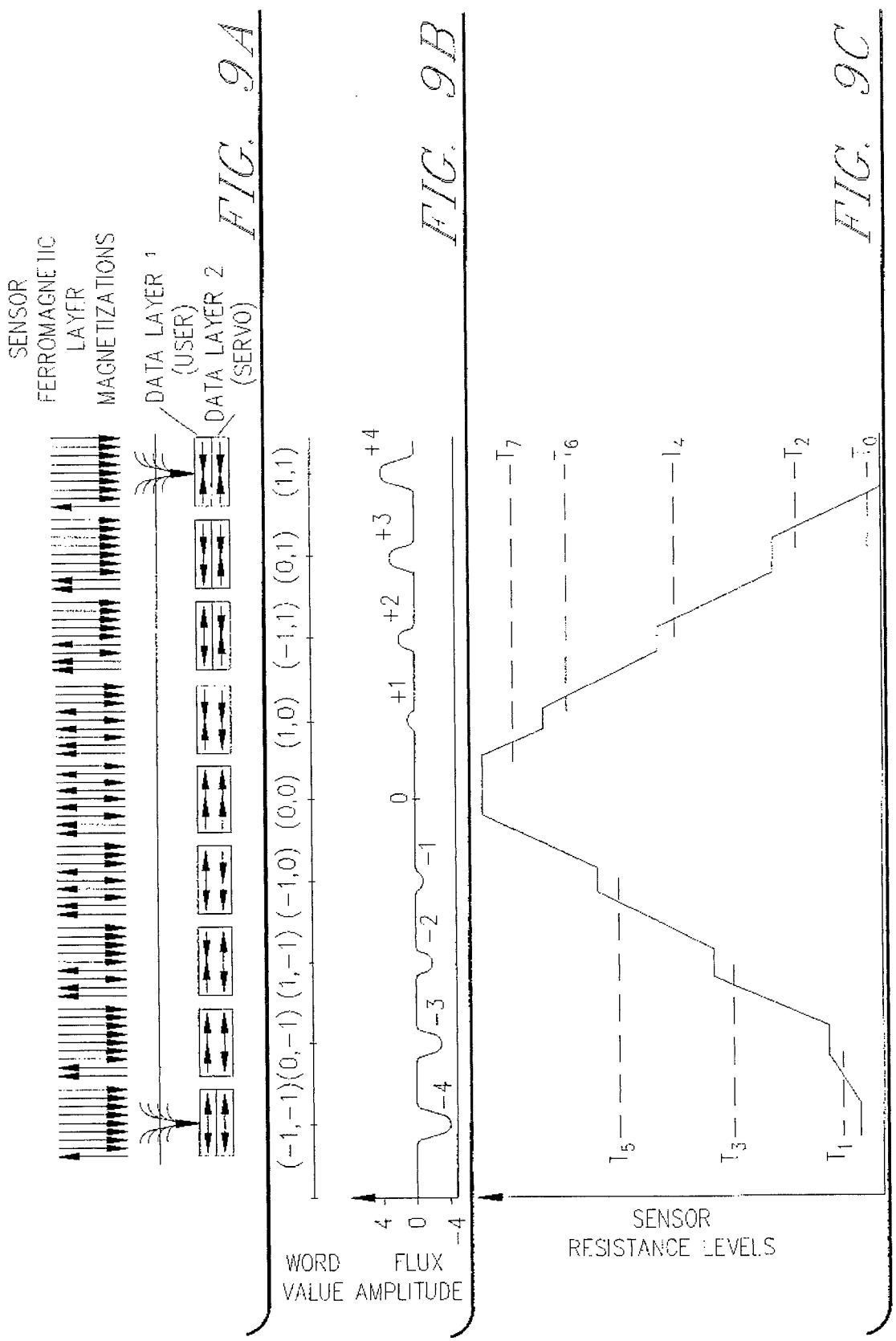

| $V_{SIC}$ | SERVO | DATA |
|---|---|---|
| $V < T_0$ | 1 | 1 |
| $T_0 < V < T_1$ | −1 | −1 |
| $T_1 < V < T_2$ | −1 | 0 |
| $T_2 < V < T_3$ | 1 | 0 |
| $T_3 < V < T_4$ | −1 | 1 |
| $T_4 < V < T_5$ | 1 | −1 |
| $T_5 < V < T_6$ | 0 | −1 |
| $T_6 < V < T_7$ | 0 | 1 |
| $T_7 < V$ | 0 | 0 |

*FIG. 11*

DIGITAL MAGNETORESISTIVE SENSOR BASED ON THE GIANT MAGNETORESISTANCE EFFECT

RELATED APPLICATIONS

This application and co-pending concurrently filed application, Ser. No. 08/441,100, are based on a common specification. This application is directed to the "DIGITAL MAGNETORESISTIVE SENSOR BASED ON THE GIANT MAGNETORESISTANCE EFFECT" and application Ser. No. 08/441,100 is directed to the "MULTIPLE DATA LAYER MAGNETIC RECORDING DATA STORAGE SYSTEM WITH DIGITAL MAGNETORESISTIVE READ SENSOR."

TECHNICAL FIELD

This invention relates generally to a magnetoresistive (MR) sensor based on the giant magnetoresistance (GMR) effect, and in particular to such a sensor for use in magnetic recording data storage systems.

BACKGROUND OF THE INVENTION

MR sensors are used as the magnetic read sensors or "heads" in magnetic recording data storage systems, such as magnetic recording disk drives. An MR sensor detects magnetic field signals through the resistance changes of a read element, fabricated of a magnetic material, as a function of the strength and direction of magnetic flux being sensed by the read element. The conventional MR sensor operates on the basis of the anisotropic magnetoresistive (AMR) effect in which a component of the read element resistance varies as the square of the cosine of the angle between the magnetization in the read element and the direction of sense current flow through the read element. Recorded data can be read from a magnetic medium because the external magnetic field from the recorded medium (the signal field) causes a change in the direction of magnetization in the read element, which in turn causes a change in resistance in the read element and a corresponding change in the sensed current or voltage. Conventional MR sensors based on the AMR effect thus provide an essentially analog signal output, wherein the resistance and hence signal output is directly related to the strength of the magnetic field being sensed.

A different and more pronounced magnetoresistance, called giant magnetoresistance (GMR), has been observed in a variety of magnetic multilayered structures, the essential feature being at least two ferromagnetic metal layers separated by a nonferromagnetic metal layer. This GMR effect has been found in a variety of systems, such as Fe/Cr, Co/Cu, or Co/Ru multilayers exhibiting strong antiferromagnetic coupling of the ferromagnetic layers. This GMR effect has also been observed for these types of multilayer structures, but wherein the ferromagnetic layers have a single crystalline structure and thus exhibit uniaxial magnetic anisotropy, as described in U.S. Pat. No. 5,134,533 and by K. Inomata, et al., *J. Appl. Phys.* 74 (6), Sep. 15, 1993. The physical origin of the GMR effect is that the application of an external magnetic field causes a reorientation of all of the magnetic moments of the ferromagnetic layers. This in turn causes a change in the spin-dependent scattering of conduction electrons and thus a change in the electrical resistance of the multilayered structure. The resistance of the structure thus changes as the relative alignment of the magnetizations of the ferromagnetic layers changes. MR sensors based on the GMR effect also provide an essentially analog signal output.

In a magnetic recording system data is stored in a thin data layer, typically a cobalt-based magnetic alloy, deposited on a substrate, such as a disk blank used in magnetic recording disks. Data is stored in the form of magnetic domains or "bits" in circumferential concentric tracks in the magnetic layer on the disk. The data is written by an inductive write head comprised of a magnetically soft magnetic pole, magnetized by passing a current through a thin film coil surrounding the pole. The written data is read by a conventional MR read head based on the AMR effect. The amount of data that can be stored in such a system is limited by the size of the magnetic bit, i.e., the smallest unit of recorded information, and the data area available on the disk.

Magnetic recording data storage technologies, particularly magnetic disk drive technologies, have undergone enormous increases in stored data per unit area of media (areal data density). This has occurred primarily by reducing the size of the magnetic bit through a reduction in the size of the read and write heads and a reduction in the head-disk spacing. At the same time, the size of the disk drive and thus the size of the disks has continued to decrease. This results in an ever decreasing amount of magnetic real estate available for the data. In conventional disk drives the data is stored in a single data layer on each side of the disk substrate.

It would be advantageous to increase the areal data density not by reducing the size of a single magnetic bit, but by use of a plurality of independent, magnetically isolated magnetic data layers formed on the disk substrate. However it is not possible to read the data from multiple magnetic data layers simultaneously, using either conventional MR sensors based on the AMR effect or proposed MR sensors based on the GMR effect, because such sensors produce an analog output signal that is not capable of directly distinguishing between the discrete magnetic field levels that are generated by the superposed data from the multiple data layers.

SUMMARY OF THE INVENTION

The invention is a digital MR sensor based on the GMR effect. The multilayer stack making up the GMR device has a single crystalline structure so that each of the ferromagnetic layers exhibits uniaxial magnetic anisotropy, i.e. the magnetic moments of the ferromagnetic layers can lie only parallel or antiparallel to a single axis. Unlike GMR multilayers where all of the magnetic moments are affected simultaneously by the external magnetic field, in the present GMR sensor each ferromagnetic layer has its magnetic moment responsive to an external magnetic field strength that is different from the magnetic field strengths at which the magnetic moments of the other ferromagnetic layers are responsive. This allows each ferromagnetic layer to switch its magnetization direction from parallel to antiparallel, or vice versa, independently of the other ferromagnetic layers. In the preferred embodiment this unique property of each ferromagnetic layer is accomplished by selecting each ferromagnetic layer to have a different uniaxial magnetic anisotropy energy, such as by varying the strain during crystalline growth. Alternatively, each ferromagnetic layer can be subjected to a different value of antiferromagnetic exchange coupling energy, such as by varying the thicknesses of the nonferromagnetic metal spacer layers. As a result, the resistance of the GMR sensor changes in stepped increments as the external magnetic field is varied, thereby providing a digital signal output.

This digital GMR sensor can be used as a read head in a multiple data layer magnetic recording data storage system. In one disk drive embodiment, the magnetic recording disk has two magnetically isolated and decoupled magnetic data layers. Data can be recorded into each of the data layers independently by appropriate selection of the coercivity of the materials used in the data layers and the strength of the write current in an inductive write head. In one embodiment for independently writing to any of the data layers, the data layers are made of magnetic materials having different coercivity vs. temperature dependencies, and the disk is heated (or not heated) prior to writing with a write field that affects only one of the data layers. The magnetic field strength from recorded data in each of the data layers is different from that of the other data layers so that the data can be distinguished by the digital GMR sensor. The digital GMR sensor reads the written data bits from both data layers simultaneously. The magnetic flux from the bits in the two data layers is additive or subtractive and thus generates a set of combinations of discrete magnetic field strengths. These discrete field strengths or values are sensed by the digital GMR sensor which provides a discrete signal output corresponding to the unique combination of field strengths intercepted from the superposed fields in the two data layers. The digital GMR sensor's output signal is then decoded by conventional logic circuitry to provide the separate data recorded in each of the data layers. For a fuller understanding of the nature and advantages of the present invention, reference should be made to the following detailed description taken together with the accompanying figures.

BRIEF DESCRIPTION OF THE DRAWING

FIG. 9A illustrates the orientation of the magnetic moments of each of the nine ferromagnetic layers of the digital GMR sensor for each of the possible flux levels or magnetic words.

FIG. 9B illustrates the nine possible combinations of bit transitions for the two data layers, their corresponding magnetic word values, and their corresponding flux levels.

FIG. 9C illustrates the discrete steps in resistance change of the digital GMR sensor in response to different flux levels from a two data layer disk.

FIG. 11 is a logic table for the detection circuit of the two data layer disk drive example of FIGS. 9A–9C.

DETAILED DESCRIPTION OF THE INVENTION

Prior Art

Figure 1:
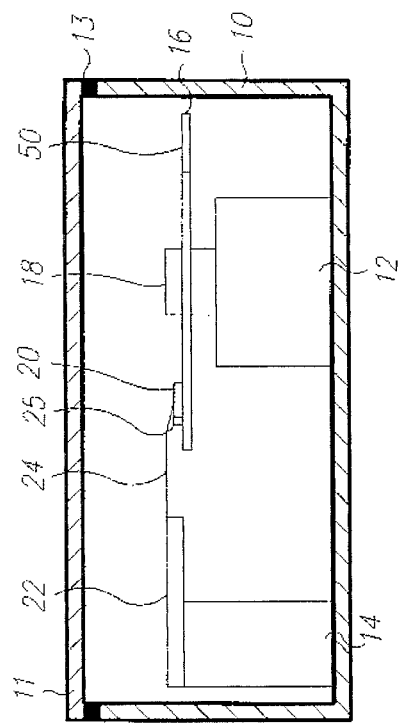
FIG. 1 is a simplified sectional view of a conventional prior art magnetic recording disk drive.

Although the digital GMR sensor of the present invention will be described in conjunction with a magnetic recording disk data storage system, as shown in FIG. 1, the sensor also has application to other magnetic recording systems, such as a magnetic tape recording system, and to other technologies, such as magnetic field sensors and magnetic random access memory systems wherein a magnetoresistive element serves as a bit cell.

Referring to FIG. 1, there is illustrated in sectional view a schematic of a prior art disk drive of the type using a conventional inductive write head and MR read head based on the AMR effect. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 with a conventional single cobalt-alloy magnetic layer is connected to drive motor 12 by means of hub 18 to which it is attached for rotation by the drive motor 12. A thin lubricant film 50 is typically maintained on the surface of disk 16. A read/write head or transducer 25 is formed on the trailing end of a carrier, such as an air-bearing slider 20. Read/write transducer 25 comprises an inductive write head and a magnetoresistive (MR) read transducer. The slider 20 is connected to the actuator 14 by means of a rigid arm 22 and a suspension 24. The suspension 24 provides a biasing force that urges the slider 20 onto the surface of the recording disk 16. During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write transducer 25 may access different data tracks on disk 16.

Figure 2:
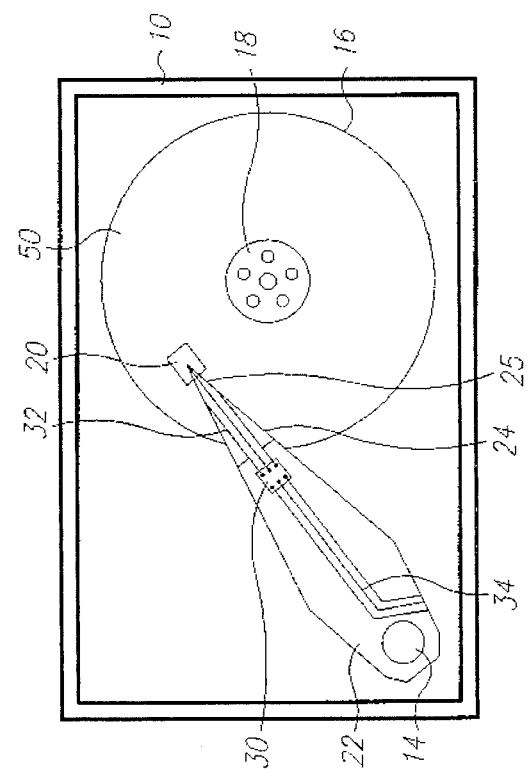
FIG. 2 is a top view of the prior art disk drive of FIG. 1 with the cover removed.

FIG. 2 is a top view of the interior of the disk drive with the cover 11 removed, and illustrates in better detail the suspension 24 that provides a force to the slider 20 to urge it toward the disk 16. The suspension may be a conventional type of suspension such as the well-known Watrous suspension, as described in U.S. Pat. No. 4,167,765 assigned to IBM. This type of suspension also provides a gimbaled attachment of the slider that allows the slider to pitch and roll as it rides on the air bearing. The data detected from disk 16 by the MR read head of transducer 25 is processed into a data readback signal by signal amplification and processing circuitry in the integrated circuit chip 30 located on arm 22. The signals from transducer 25 travel via flex cable 32 to chip 30, which sends its output signals via cable 34. The above description of a typical magnetic disk storage system, and the accompanying FIGS. 1 and 2, are for representation purposes only. Typically a magnetic layer is formed on each side of the disk substrate and each side of the disk 16 may thus have one or more sliders associated with it. Also, disk drives may contain a number of disks and actuators, and each actuator may support a number of sliders.

Preferred Embodiments

Figure 3:
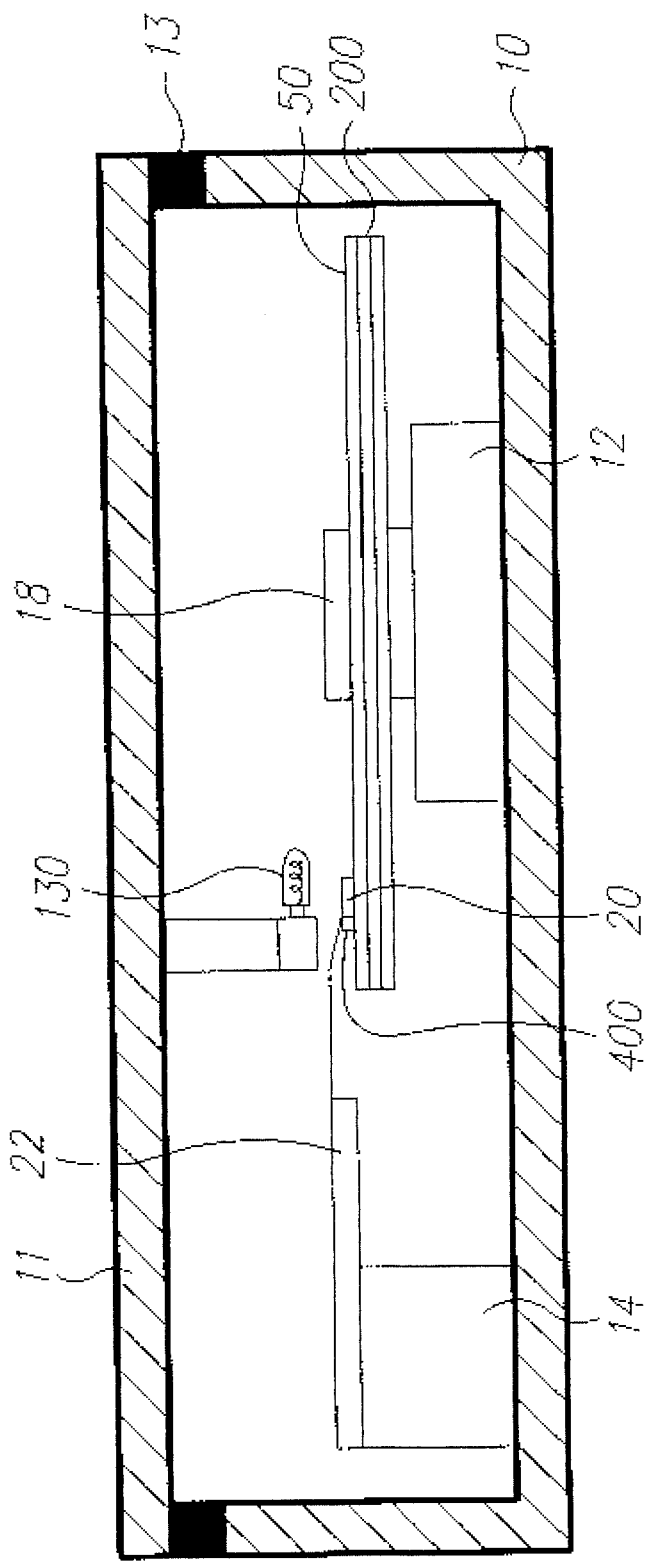
FIG. 3 is a simplified sectional view of a multiple data layer magnetic recording disk drive according to the present invention.

FIG. 3 shows a schematic sectional view of the disk drive of the present invention illustrating a multiple data layer magnetic disk 200 in place of the conventional single data layer disk (disk 16 in FIG. 1) and a digital GMR read sensor 400 in place of the conventional MR read head (the MR read head of transducer 25 in FIG. 1). In one embodiment of the present invention a heater, such as lamp 130, is used for locally heating portions of the disk 200. The heater is preferably an ultraviolet heat lamp. Alternatively a semiconductor laser with a focusing lens may be used. The heater enables selective writing to particular magnetic layers in the multiple data layer disk 200 in the manner to be described.

The Digital GMR Sensor

Figure 4:
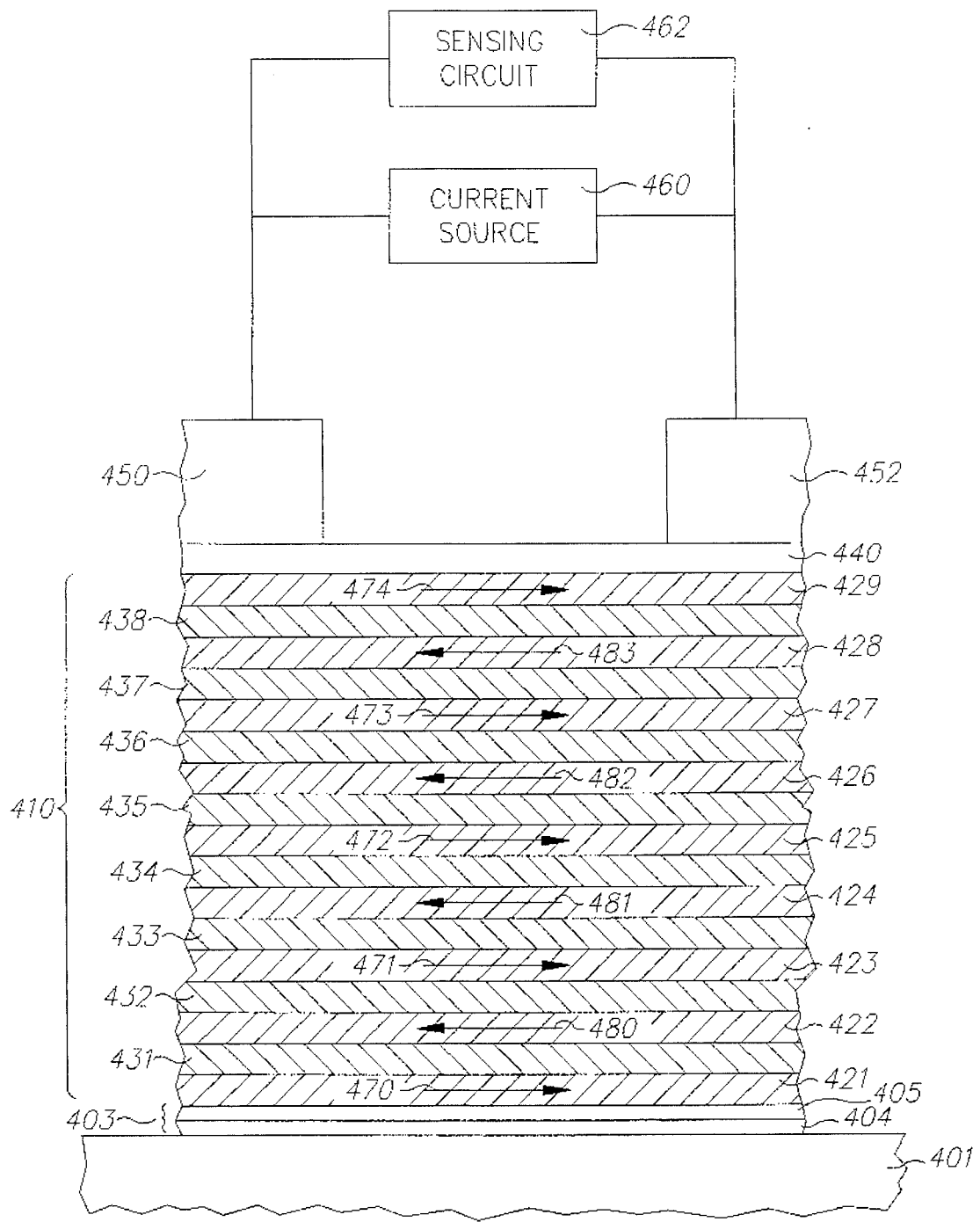
FIG. 4 is a schematic sectional view of the digital GMR sensor according to the present invention.

FIG. 4 shows a schematic sectional view of the digital GMR sensor, designated as item 400. The sensor includes a substrate 401, a seed layer 403 formed on the substrate 401 and a stack 410 of alternating ferromagnetic layers and nonferromagnetic metal spacer layers formed on seed layer 403. The stack 410 contains at least three ferromagnetic layers and two nonferromagnetic layers, in which case, as will be explained later, the sensor will provide a three-level digital output centered about zero external magnetic field. However, in the embodiment of FIG. 4 there are nine magnetic layers 421–429 separated by eight nonferromagnetic metal layers 431–438, in which case the sensor 400 will provide a nine-level digital output centered about zero external magnetic field. The sensor 400 includes a protective or capping layer 440 and electrical leads 450, 452. The leads 450, 452 provide electrical connection to a current source 460 and a signal sensing circuit 462. The top (429) or bottom (421) ferromagnetic layer may also have its magnetization fixed by a separate biasing layer (not shown).

The sensor's multilayer stack 410 is preferably formed from ferromagnetic layers 421–429 of cobalt (Co) or permalloy ($Ni_xFe_{1-x}$, where x is approximately 0.81) and nonferromagnetic metallic spacer layers 431–438 of copper (Cu). Alternative ferromagnetic materials are binary and ternary alloys of Co, nickel (Ni) and iron (Fe) and alternative nonferromagnetic metals are silver (Ag), gold (Au) and alloys of Cu, Ag and Au. Such multilayer structures exhibit GMR in that the ferromagnetic layers are antiferromagnetically coupled across the spacer layers and the relative alignments of the magnetizations of the ferromagnetic layers vary in the presence of an external magnetic field. However, unlike the previously reported GMR structures, the multilayer stack 410 is fabricated such that it exhibits the property that each of the ferromagnetic layers 421–429 switches its magnetization orientation independently and individually at discrete external magnetic field levels.

In the present invention, the stack 410 is a crystalline multilayer grown in such a manner that each of the ferromagnetic layers 421–429 exhibits an intrinsic two-fold in-plane uniaxial magnetic anisotropy. This means that in the absence of an external magnetic field the crystalline structure of each ferromagnetic layer induces the magnetization to be aligned either parallel or antiparallel to a single axis. Molecular beam epitaxy (MBE) can be used to prepare the crystalline multilayer. However, recently it has been shown that a crystalline multilayer can be formed by the simpler process of sputter deposition, as described for example by Harp and Parkin, *Appl. Phys. Lett.* 65 (24), 3063 (Dec. 12, 1994).

The substrate 401 is preferably a crystal of polished 110 magnesium oxide (MgO). The seed layer 403 comprises a bilayer of an iron (Fe) film 404 and a platinum (Pt) film 405. The Fe film 403 is sputter deposited first to a thickness of approximately 5–10 Angstrom followed by sputter deposition of the Pt film 405 to a thickness of approximately 30–50 Angstrom. The Fe and Pt films are grown at approximately 500 degC or higher to obtain the best multilayer crystallinity, i.e., to avoid significant interdiffusion of dissimilar metals in the structure. It is important to obtain an essentially single crystallographic orientation of the multilayer stack 410 since the uniaxial magnetic anisotropy of each of the ferromagnetic layers 421–429 reflects the crystallographic symmetry of the crystalline multilayer. In particular, for multilayers containing ferromagnetic layers of permalloy or Co, oriented along the 110 direction, each of the ferromagnetic layers 421–429 exhibits a large in-plane uniaxial magnetic anisotropy.

As shown by arrows 470–474 and oppositely directed arrows 480–483, alternate ferromagnetic layers 421–429 have their magnetizations oriented antiparallel in the absence of an external magnetic field. This antiparallel alignment is due to the intrinsic uniaxial anisotropy and the antiferromagnetic coupling across the Cu spacer layers 431–438.

Figure 5:
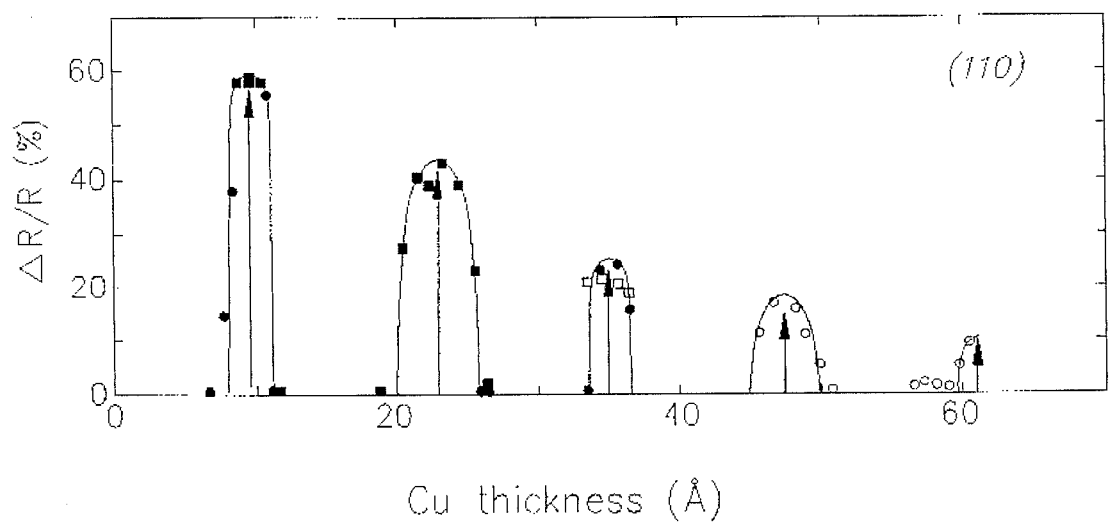
FIG. 5 shows the typical relationship of room temperature saturation magnetoresistance of a crystalline multilayer stack in the digital GMR sensor as a function of spacer layer thickness, and illustrates the specific relationship for crystalline Co/Cu multilayers oriented along a 110 crystal direction.

The Cu (or other spacer layer) thickness has to be chosen to lie within limited ranges for which the permalloy, Co, or related ferromagnetic layers are coupled antiferromagnetically. For such ranges of spacer layer thickness GMR is observed. FIG. 5 shows the dependence of the saturation GMR in Co/Cu multilayers at room temperature in essentially single crystalline 110 oriented multilayers grown using magnetron sputter deposition. The Co/Cu multilayers used to generate the data of FIG. 5 were deposited at approximately 50 degC in 3.3 mTorr Argon at deposition rates of approximately 2 Angstrom/sec. Seed layers of 5 Angstrom Fe/50 Angstrom Pt were grown at 500 degC on a substrate of 110 MgO. In the preferred embodiment for sensor 400 the ferromagnetic layers 421–429 are permalloy of 15 Angstrom thickness and the spacer layers 431–438 are sputter deposited Cu of 19.5 Angstrom thickness. Data from a curve similar to that of FIG. 5 was used to select the Cu thickness for sensor 400.

The uniaxial magnetic anisotropy of the multilayer stack 410 is consistent with the two-fold crystallographic symmetry of the 110 face. Other crystal faces with two-fold symmetries also give rise to an in-plane uniaxial magnetic anisotropy field. By taking advantage of this large in-plane magnetic anisotropy a multilayered structure can be fabricated for which each ferromagnetic layer in the structure switches its magnetization direction at a distinct external magnetic field level. For Co/Cu and permalloy/Cu GMR multilayers, this leads to a digital MR sensor based on the GMR effect that is capable of detecting and distinguishing external magnetic fields in different discrete field strength ranges. The number of ferromagnetic layers can be selected so that different numbers of field strength ranges can be detected.

The dependence of the magnitude of the magnetization of the GMR multilayer structure on the external magnetic field, which directly determines the dependence of the resistance of the structure on the external magnetic field, is determined by a number of energies, including primarily the Zeeman energy of each ferromagnetic layer in the external magnetic field, the magnetic interlayer antiferromagnetic exchange coupling energy between neighboring ferromagnetic layers, and the magnetic anisotropy energy of each ferromagnetic layer. Additional energy contributions include the demagnetizing fields, the magnetostatic coupling between the ferromagnetic layers, the self-field of the sense current passing through the structure, and any biasing fields applied to the ferromagnetic layers from other biasing layers or biasing elements of the sensor.

Let $M_i$ be the magnetization of the i'th ferromagnetic layer, $t_i$ the thickness of the i'th layer, $H^{ext}$ the external magnetic field applied in the plane of the ferromagnetic layer along the x axis, and $\Theta_i$ the angle the magnetic moment of the i'th layer makes with the x axis. The magnetic moments of the ferromagnetic layers lie in the plane of the layers because the layers are sufficiently thick that demagnetizing fields will ensure this. Consider first the simple case where the only significant energies are the Zeeman energy and the interlayer antiferromagnetic coupling energy. The Zeeman energy of layer i can be written as:

$$E_i^z = -M_i H^{ext} \cos(\Theta_i)$$

The interlayer antiferromagnetic coupling energy of layer i can be written as:

$$E_i^{af} = -J_{i,i+1} \cos(\Theta_i - \Theta_{i+1}) - J_{i,i-1} \cos(\Theta_i - \Theta_{i-1})$$

where i is in the range 1 to N, and N is the number of ferromagnetic layers. $J_{ij}$ is the strength of the magnetic coupling between the i'th and j'th layers. The ferromagnetic layers are coupled antiferromagnetically so that J is negative in sign. Also, $H_{ij}^{af} = J_{ij}/M_i t_i$, where $H_{ij}^{af}$ is the antiferromagnetic exchange coupling field exerted on layer i by layer j. In this simple case, where the ferromagnetic layers have no significant magnetic anisotropy energy, the individual magnetic moments of the ferromagnetic layers will rotate continuously in an external magnetic field such that $\Theta_i$ varies continuously as the external magnetic field varies. If a sufficiently large magnetic field is applied such that $H^{ext} > H_{ij}^{af}$ then the magnetic moments will all be aligned parallel along the x direction. As $H^{ext}$ is reduced from this large value the magnetic moments of the ferromagnetic layers will rotate continuously away from x until, at close to zero external field, they are arranged alternately at 90 degrees to the x direction with the moments of adjacent ferromagnetic layers being aligned antiparallel to one another.

Consider now the case where the individual ferromagnetic magnetic layers exhibit a significant uniaxial magnetic anisotropy in the plane of the layer. This anisotropy energy is described as:

$$E_i^k = K_i t_i \sin^2(\Theta_i)$$

where $K_i$ is the uniaxial anisotropy constant of the i'th ferromagnetic layer and is related to $H_i^k$, the anisotropy field of the i'th layer, by the relation $K_i = H_i^k M_i/2$. Thus the magnetic moment of each ferromagnetic layer prefers to lie along the x direction, the magnetic easy axis. As the magnitude of $H_i^k$ is varied from zero the moment of the i'th layer no longer rotates continuously as the external magnetic field is varied. Instead the moment of the i'th layer will rotate or switch by 180 degrees (from parallel to x to antiparallel to x, or vice versa) over a narrow field range, where the field range is determined by the magnitude of $H_i^k$ compared to $H_{i,i+1}^{af}$ and $H_{i,j-1}^{af}$, i.e. the two antiferromagnetic coupling fields applied to the i'th layer by the two adjacent ferromagnetic layers. Abrupt switching is obtained when $H_i^k$ is comparable to or larger than the sum of $H_{i,i+1}^{af}$ and $H_{i,i-1}^{af}$. Abrupt switching of one ferromagnetic layer will lead to a change in the resistance of the multilayer structure because the resistance of the multilayer structure depends on the configuration of the moments of the ferromagnetic layers. The magnetic moments of the individual layers in the multilayer structure will thus switch independently at distinct external field values, depending on the ratio of $H_i^k$ to the sum of $H_{i,i+1}^{af}$ and $H_{i,i-1}^{af}$.

There are several ways of making the digital GMR sensor of the present invention, i.e., a multilayer GMR structure with ferromagnetic layers exhibiting uniaxial magnetic anisotropy wherein the ferromagnetic layers have different magnetic properties so that each ferromagnetic layer will switch its magnetic moment at different external magnetic fields.

In the preferred embodiment the uniaxial magnetic anisotropy energies of individual ferromagnetic layers in the sensor are selected to have different values by varying the crystalline strain imposed in each ferromagnetic layer. The crystalline lattice of any given ferromagnetic layer is distorted from the perfect crystalline lattice exhibited by the same material in thick layers or in bulk form by strain imposed by epitaxial growth of the layer on the underlying layers. The strain will be largest in the layer grown directly on the seed layer on the substrate. The strain decreases as the separation of the ferromagnetic layer from the seed layer is increased and the crystalline lattice relaxes to that of the bulk material. The sensor 400 of FIG. 4 has a multilayer stack 410 comprised of ferromagnetic layers of a $Ni_{1-x}Fe_x$ alloy and nonmagnetic spacer layers of Cu, grown on seed layers of 5 Angstrom Fe/50 Angstrom Pt on the 110 crystalline face of MgO. Each subsequent ferromagnetic layer 421–429 from the seed layer has less strain, and thus reduced uniaxial magnetic anisotropy energy, than the layer beneath it.

As alternatives to varying the crystalline strain energy of the ferromagnetic layers (to thus vary $H_i^k$), the individual ferromagnetic layers can be made to switch independently by varying certain magnetic properties of the individual ferromagnetic layers, including $H_i^k$, $J_{i,i+1}$ and $J_{i,i-1}$. This can be accomplished by varying any of the following:

the thickness of the ferromagnetic layers, $t_i$ the magnetization of the ferromagnetic layers, $M_i$ the thickness of the spacer layers the composition of the magnetic or nonmagnetic layers the detailed structural morphology of the layers.

The morphology can be varied by varying the growth conditions of the layers, e.g., by varying the sputtering pressure, deposition rate, or deposition temperature, by ion bombardment of the layers during growth (e.g., with low energy, approximately 100 eV, argon ions), or by varying the interface roughness and composition. This can be accomplished by inserting thin layers of another material at the interfaces between the ferromagnetic and nonferromagnetic layers, by ion-bombarding the layers after depositing them, by annealing the multilayer after growth, or by annealing part of the multilayer during growth.

In all cases the result is that each ferromagnetic layer in the multilayer has a unique combination of properties, especially the strength, symmetry and orientation of its magnetic anisotropy, and the strength of the antiferromagnetic exchange coupling with its adjacent ferromagnetic layers. These properties determine both the strength of the external field at which the magnetic moment of the ferromagnetic layer in the multilayer switches and the abruptness with which the switching takes place.

In addition to modifying the structure to obtain distinct switching fields for the individual ferromagnetic layers, by modifying the structure in the ways described above, the structure may also be modified in similar ways to give rise to different changes in resistance associated with the magnetic switching of any particular ferromagnetic layer.

Figure 6A:
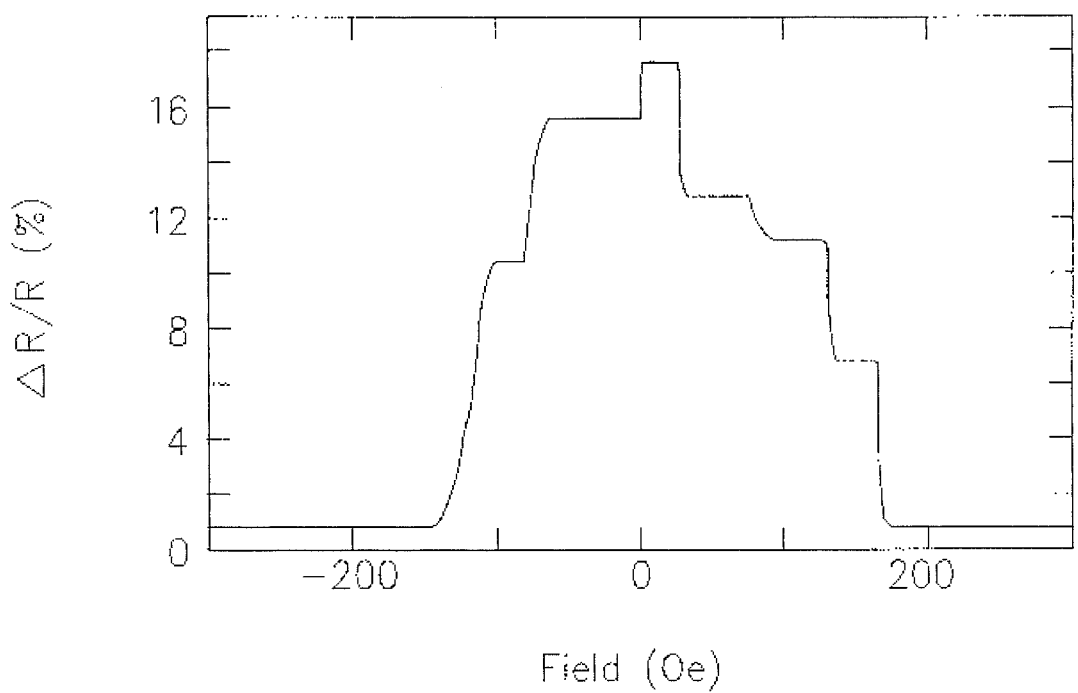
FIGS. 6A and 6B show the field dependence of the magnetoresistance and in-plane magnetization, respectively, of the digital GMR sensor having a crystalline permalloy/Cu multilayer stack with nine ferromagnetic layers.
Figure 6B:
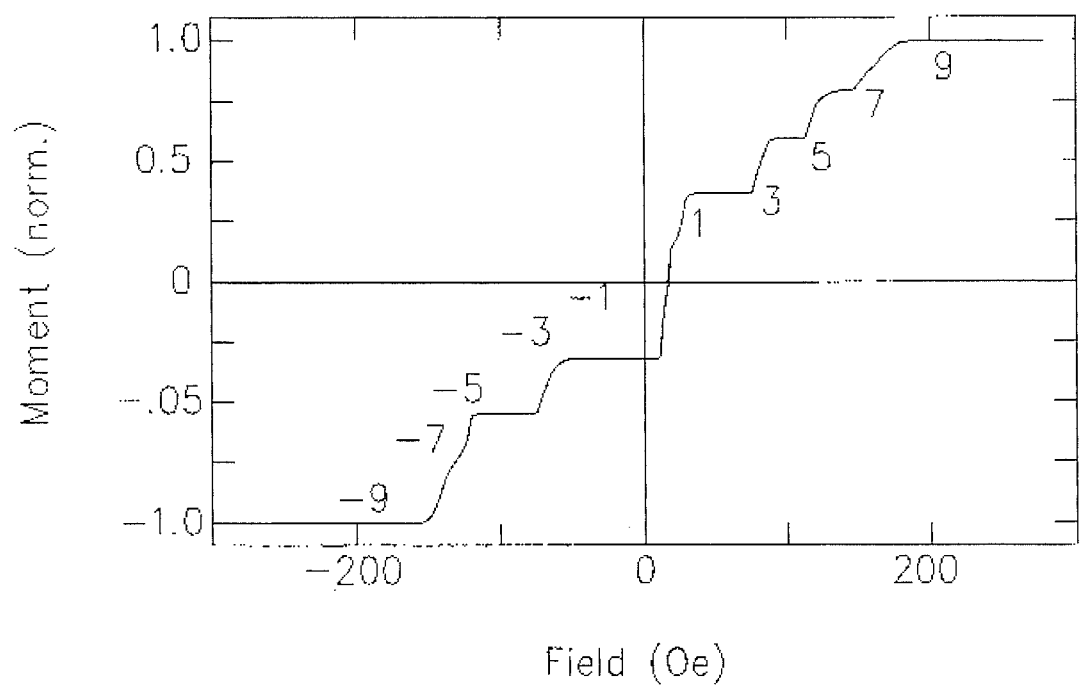

FIG. 6A shows typical magnetoresistance versus field data for the sensor 400 with the (110) oriented permalloy/Cu multilayer stack 410. FIG. 6A shows that the resistance displays a series of steps with increasing or decreasing magnetic field. FIG. 6B shows the similar relationship of magnetic moment versus field. FIG. 6B shows that the magnetization of the multilayer stack 410 displays a series of steps for different external field ranges. This behavior is due to the individual magnetic moments of the individual magnetic layers 421–429 switching independently and successively as the external field is swept from −200 to +200 Oersteds (Oe).

The Multiple Data Layer Disk and Writing to the Multiple Data Layers

Figure 7:
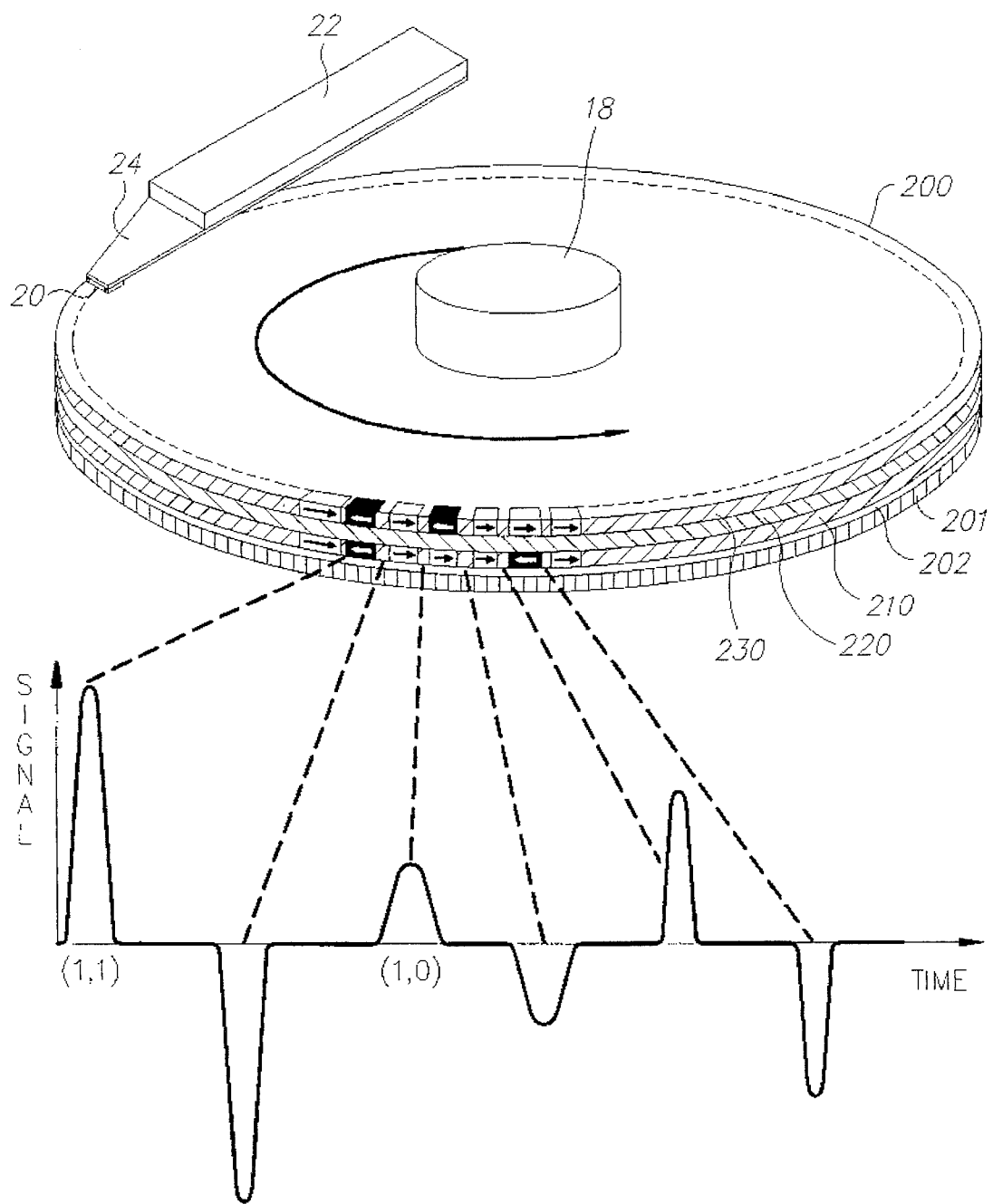
FIG. 7 is a schematic of a two data layer disk illustrating typical magnetic bit combinations and the corresponding signal output when intercepted by the digital GMR sensor.

The multiple data layer storage medium is represented as disk 200 in FIG. 7. The disk substrate 201 is a conventional substrate, such as glass or an aluminum alloy disk blank with a nickel-phosphorous (NIP) surface coating. The disk substrate 201 supports a number of thin magnetic layers, which may be formed of a conventional sputter-deposited cobalt alloy, that are magnetically decoupled from one another by thin nonferromagnetic decoupling layers formed of, for example, an electrical insulator or a metal, such as alumina ($Al_2O_3$) or tantalum (Ta). Two independently recordable magnetic data layers 210, 230 are shown in FIG. 7 separated by decoupling layer 220. An underlayer 202 of chromium or other suitable material may be formed between substrate 201 and the first data layer 210. The magnetic data layers 210, 230 and decoupling layer 220 must be thin enough such that there is sufficient magnetic flux from the boundaries between adjacent magnetic bits in the lower magnetic layer 210 to enable these bits to be resolved above the top magnetic layer 230 by the digital GMR sensor 400 (FIG. 3). While only two magnetically isolated magnetic data layers are shown in FIG. 7 for ease of illustration and explanation, the invention is capable of use with three or more data layers.

Each of the magnetic data layers is preferably comprised of a different magnetic material, or of the same material but with a different composition, that is selected so that each magnetic layer has an appropriate magnetic moment, magnetic anisotropy and coercivity. The data layers are required to have different magnetic moments so that when the superposed flux from the multiple data layers is received by the sensor the sensor output can distinguish the data from the different data layers. Similarly, the data layers are required to have different coercivities to allow writing on each of the magnetic layers independently without affecting the data previously written on the other data layers. The required properties of the magnetic layers depend on the writing scheme. There are two possible writing schemes that will be described, referred to as sequential layer write and selectable layer write.

In the sequential layer write scheme each of the magnetic layers has a different coercivity. This is accomplished by forming the data layers of different magnetic materials or alloy compositions, e.g., from various Co-Pt-Cr, Co-Pr-Cr-B or other similar alloys, and/or by varying the thicknesses of the magnetic layers. The magnetic layer with the highest coercivity is written first with a higher write current to the inductive write head and the other magnetic layers are written successively, in order of decreasing magnetic coercivity, by correspondingly decreasing the write current to the inductive write head. However, in this scheme when new data is to be written to one of the previously written magnetic layers, the other magnetic layers that have lower magnetic coercivities will also be rewritten. Nevertheless, this scheme may be particularly useful for multiple data layer disks of two magnetic layers where head servo positioning information is pre-written to the magnetic layer with the highest magnetic coercivity, such as the bottom layer 210. The servo data is never rewritten during operation of the disk drive and thus all user data is written in the top magnetic layer 230 with a write field small enough to not affect the pre-written servo data in layer 210. A two layer magnetic recording disk with the bottom higher coercivity magnetic layer containing servo data is known, and referred to as a "buried servo" implementation, but the reading of the servo data is done by a separate dedicated servo head. It is also possible to record other types of data in bottom layer 210 that is not to be rewritten, such as operating system data.

Figure 8A:
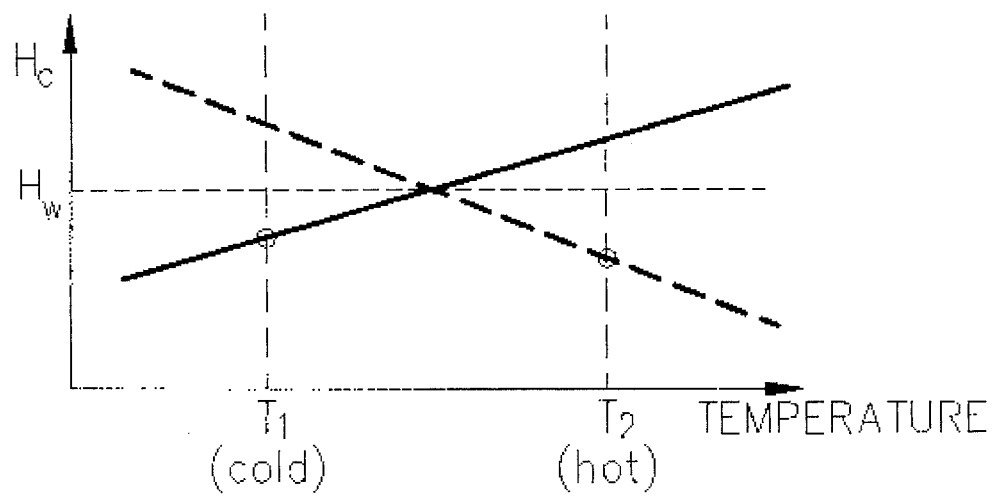
FIG. 8A illustrates the level of a fixed write field in relation to a graph of the coercivity as a function of temperature for two different magnetic materials having increasing and decreasing coercivity temperature dependence.

In the selectable layer write scheme any magnetic layer can be written independently of any other magnetic layer. This is accomplished by use of materials for the magnetic layers which have different temperature dependent magnetic coercivities. For example, the magnetic layers can be formed from a ferromagnetic metal, for example, a rare-earth-3d transition metal alloy, e.g., Tb-Fe-Co. By selection of the specific composition of the alloy, the compensation temperature, i.e., the temperature where the coercivity becomes relatively high, can also be selected. For alloys for which the compensation temperature is above the operating temperature of the disk drive ($T_{oper}$), the coercivity increases as the temperature is increased above $T_{oper}$. In contrast, for alloys for which the compensation temperature is below $T_{oper}$, the coercivity decreases as the temperature is increased above $T_{oper}$. This is shown in FIG. 8A. In this case the material in the bottom magnetic layer 210 has the temperature dependence shown by the solid line and the material in the top magnetic layer 230 has the temperature dependence shown by the dashed line. By varying the temperature of the magnetic layers through use of the lamp 130 (FIG. 3) it is possible to arrange for the coercivity of layer 210 to be lower (when the temperature is at $T_1$ near $T_{oper}$) or higher (when the temperature is at $T_2$ above $T_{oper}$) than the coercivity of magnetic layer 230. Thus as shown by FIG. 8A, a fixed write current is applied to the inductive write head to generate a fixed write field $H_w$. When it is desired to write data on layer 210 the lamp 130 is not turned on and writing occurs at temperature $T_1$ near $T_{oper}$. Because at this temperature the write field is less than the coercivity of layer 230, data on layer 230 is not affected. Similarly when it is desired to write data on layer 230 the lamp 130 is turned on to heat the disk and writing occurs at temperature $T_2$. Because at this temperature the write field is less than the coercivity of layer 210, data on layer 210 is not affected.

Figure 8B:
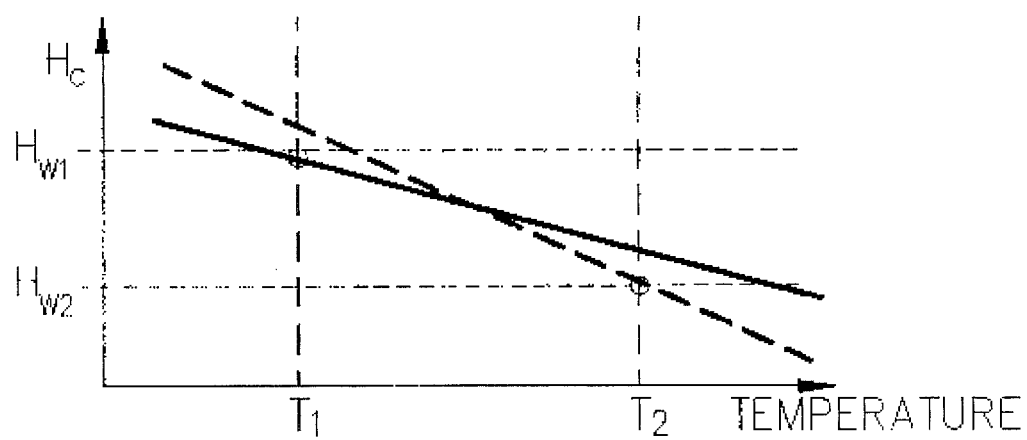
FIG. 8B illustrates the two levels of a variable write field in relation to a graph of the coercivity as a function of temperature for two different magnetic materials having different rates of decreasing coercivity with increasing temperature.

The different temperature dependent magnetic coercivities can be similarly accomplished by varying the magnetic layer compositions so that the rate of increase or decrease of the coercivity of each layer with temperature is different. This is shown in FIG. 8B. In this case both data layer 210 (solid line) and data layer 230 (dashed line) have temperature dependent coercivities that decrease with temperature, but the rate of decrease is greater for the material in data layer 230. Thus either of data layers 210, 230 can be written independently of the other by using an appropriate level of write current to the inductive head. When it is desired to write data on layer 210 the lamp 130 is not turned on and writing occurs at temperature $T_1$ near $T_{oper}$ with a write current that generates a write field $H_{w1}$. Because at this temperature the write field is less than the coercivity of layer 230, data on layer 230 is not affected. Similarly when it is desired to write data on layer 230 the lamp 130 is turned on to heat the disk and writing occurs at temperature $T_2$ with a write current that generates a write field $H_{w2}$. Because at this temperature the write field is less than the coercivity of layer 210, data on layer 210 is not affected.

To take advantage of the temperature dependence of coercivity of the materials in the data layers in the manner illustrated by FIGS. 8A and 8B it is desirable that there be thermal linkage of the data layers so that they are both adequately heated by lamp 130. However, by thermally decoupling the top layer 230 from the bottom layer 210 by use of a magnetic decoupling layer 220 that also has a low thermal conductivity, such as quartz, it is possible to heat one data layer significantly more than the other data layer. This makes it possible to vary the coercivities of the magnetic layers by heating even if the magnetic layers are made of essentially the same magnetic material and/or have essentially the same coercivity-temperature relationship.

An appropriate material for magnetic decoupling layer 220 in the disk drive embodiment where the selective layer write scheme is to be used is one that not only magnetically decouples the ferromagnetic layers above and below it, but also provides optimal thermal linkage between the ferromagnetic layers and is stable under temperature cycling with regard to interaction with neighboring layers. The decoupling layer 220 is preferably formed from an electrical insulator, such as alumina. Alumina can be fabricated very thin (approximately 20 Angstrom) and yet be substantially pin-hole free. It is important that the decoupling layer 220 be free of pin-holes to reliably decouple the ferromagnetic layers. Alternatively, the decoupling layer 220 can be made of a thin metallic layer. For very thin metal decoupling layers, appropriate metals are one of the light 3d, 4d, or 5d transition metals and their alloys, because these metals give rise to weak intrinsic magnetic interlayer exchange coupling between ferromagnetic metallic layers, as described by Parkin, *Phys. Rev. Lett.* 67, 3598 (1991). For thicker metal decoupling layers other metals including chromium (Cr) or rhenium (Re) are appropriate.

As shown in FIG. 7, the magnetic bits depicted by arrows are generally vertically aligned with one another in the top and bottom data layers. This is required to allow the bits in both data layers to be read simultaneously as a magnetic word by the digital GMR sensor. This alignment of the bits in adjacent disk data layers during writing of data is no more difficult than reproducibly writing a single bit in a conventional single data layer disk. The disk drive contains servo head positioning information that is used to control the position of the write head and assures that data bits are written at essentially the same position relative to servo data. This servo information is written before any data is written on the data layers, and may be written on one of the data layers in the multiple data layer disk.

Reading the Multiple Data Layers with the Digital GMR Sensor

Referring again to FIG. 7, for a two data layer disk there are nine possible combinations of magnetic bits in the top and bottom magnetic layers at any given place on the disk. These nine include four "positive" or out of the disk flux levels, four "negative" or into the disk flux levels, and one zero flux level corresponding to no magnetic bit transition in either of the data layers. In the present invention each of these combinations of bits, i.e., a magnetic word, is read by the digital GMR sensor 400. The digital GMR read head provides a digital output, due to a change in resistance, that uniquely identifies which of these combinations is being read. As shown in FIG. 7, which shows six representatives of the nine possible magnetic words, the magnetic bits have their moments oriented parallel to the plane of the disk as in longitudinal or horizontal magnetic recording. In this case the digital GMR read head senses the superposition of magnetic flux emanating from transitions or boundaries between adjacent magnetic bits in each of the two data layers. The magnetic flux from the boundaries between bits in the individual magnetic layers sensed by the read head depends on the magnetization of each bit which depends on the magnetization of the material in that layer and the distance of that layer from the head. Thus changes in neighboring magnetic bits, corresponding to different arrangements of the magnetic bits in the layers, can be distinguished by the strength of the magnetic flux sensed at the read head.

The lower portion of FIG. 7 shows six different magnetic field or flux values from the magnetic bit transitions represented on the two data layer disk 200. In this example, assume bottom layer 210 is pre-written servo data in a magnetic layer with a higher magnetic moment so that the flux value from a single magnetic bit in that layer is three times the flux value of a single magnetic bit in the upper user data layer 230. Thus different superpositions of the flux from the two layers give rise to the different combinations of adjacent bits. The largest positive signal is obtained when the magnetic word is (1,1), corresponding to a head-to-head magnetic bit transition in both the top and bottom data layers. A smaller signal, corresponding to a magnetic word of (1,0) and having a value one-third that of word (1,1), is obtained when the only contribution to the superposed flux is from the upper user data layer, the lower servo data layer having no magnetic bit transition.

FIGS. 9A–9C illustrate the nine possible flux levels (FIG. 9B) from the two data layer disk 200, the corresponding change in resistance (FIG. 9C) of the nine-ferromagnetic layer digital sensor 400 (FIG. 4), and orientations of the magnetic moments of each of the nine ferromagnetic layers (FIG. 9A) for each of the possible flux levels. Again assume in this example that the lower data layer is servo data and the upper data layer is user data, and that the servo layer has a higher magnetic moment than the data layer and that the flux from an antiparallel bit pair in the servo layer alone is three times that of the flux from an antiparallel bit pair in the user data layer alone. For horizontal recording flux escapes these magnetic layers when adjacent bits in a layer are antiparallel.

The sensor has highest resistance when all nine ferromagnetic layers are aligned antiparallel due to their inherent uniaxial anisotropy and the antiferromagnetic coupling. This is when there is no external field present and corresponds to the 0 digital level of the sensor (0,0 word value). The sensor has lowest resistance at highest external field, i.e., when all nine ferromagnetic layers in the sensor are aligned parallel. This corresponds to the lowest resistance value, as shown in FIG. 9C. The highest external field thus occurs at points where bit pairs in both the user data layer and the servo layer are antiparallel. This is shown in FIG. 9B as corresponding, respectively, to digital sensor values of −4 and +4. The flux is reduced when one or both of the data layers has bit pairs that are aligned parallel, indicating no magnetic transition. FIG. 9C shows the stepped response of the nine ferromagnetic layer digital GMR sensor as successive ferromagnetic layers are switched from antiparallel to parallel due to changes in the flux from the disk. The steps are not necessarily equal in magnitude, but the resistance changes will vary as shown in the actual data of FIG. 5A.

Figure 10:
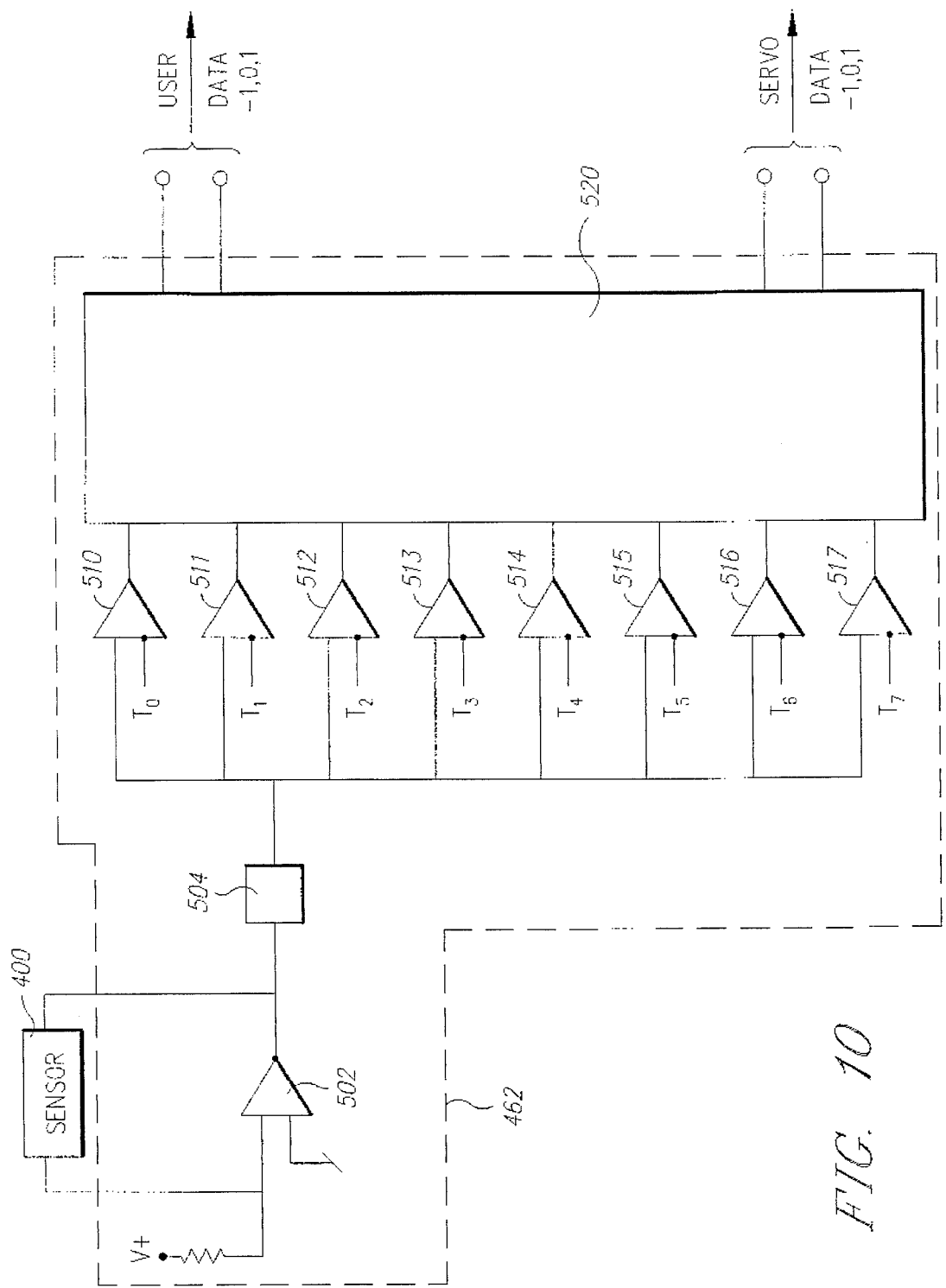
FIG. 10 is a block diagram of a detection circuit that converts the sensor output signal into separate data output signals for the separate data layers on the multiple data layer disk.

FIG. 10 is a diagram of the sensing circuit 462 (FIG. 4) for sensing the resistance levels from sensor 400 to generate an output signal $V_{sig}$ and for decoding the output signal into user data and servo data. The first step in the detection circuit is to convert the resistance changes in the sensor into a voltage $V_{sig}$. This may be done, for example, by placing the sensor in the feedback loop of an amplifier 502. This will provide a linear voltage change (gain) with resistance change. After the amplification, a high pass filter 504 reduces noise in the signal.

The output voltage $V_{sig}$ must next be converted into separate signals for the data layer and servo layer. The filtered signal is proportional to the resistance of the sensor. The signal is distributed to a set of comparators 510–517, each of which is preset to the threshold characteristic of the discrete sensor resistance states T0–T7, as shown in the resistance output of FIG. 9C. The comparator outputs are input to a logic circuit 520 that decodes the sensor levels into the unique flux transition information for each data layer on the disk. The logic circuit 520 generates the output shown by the logic table of FIG. 11. The logic output has three states for each data layer (1,0,−1) corresponding to flux out, no transition, and flux in. The logic circuit also has a clock input (not shown in FIG. 10) to track multiple 0's on the data layers (sequential absences of transitions ).

The multiple data layer data storage system has been described for the case of horizontal recording. However, the invention is also applicable to vertical or perpendicular recording wherein the individual magnetic fields in the media are oriented perpendicular to the media substrate. For the case of this perpendicular alignment of the magnetic bits with the substrate, the situation is simpler and the magnetic flux sensed at the digital GMR sensor directly corresponds to the magnetic word value. Thus for two magnetic layers in the perpendicular recording embodiment there are only four possible magnetic word values.

While the present invention has been particularly shown and described with reference to the preferred embodiments, it will be understood by those skilled in the art that various changes in form and detail may be made without departing from the spirit and scope of the invention.

What is claimed is:

1. A magnetoresistive sensor comprising:

a substrate; and a multilayer stack of alternating ferromagnetic layers and nonferromagnetic metal spacer layers formed on the substrate, the stack having at least three of the ferromagnetic layers, wherein each of the ferromagnetic layers is antiferromagnetically coupled to a neighboring ferromagnetic layer across an adjacent spacer layer and has its magnetization aligned antiparallel to the magnetization of a neighboring ferromagnetic layer in the absence of an external magnetic field, and wherein each of the ferromagnetic layers exhibits substantially uniaxial magnetic anisotropy and has its magnetization switchable from said antiparallel alignment to parallel alignment at an external magnetic field strength that is different from the magnetic field strength at which the magnetizations of the other ferromagnetic layers are switchable;

whereby the sensor exhibits discrete steps of decreasing electrical resistance in response to an increasing external magnetic field.

2. A magnetoresistive sensor as in claim 1 wherein the substrate has an essentially 110 crystalline face onto which the multilayer stack is formed.

3. A magnetoresistive sensor as in claim 2 wherein the substrate is MgO.

4. A magnetoresistive sensor as in claim 1 further comprising a seed layer formed directly on the substrate between the substrate and the multilayer stack.

5. A magnetoresistive sensor as in claim 4 wherein the seed layer comprises a first film of iron formed directly on the substrate and a second film of platinum formed directly on the iron film.

6. A magnetoresistive sensor as in claim 1 wherein the ferromagnetic layers consist essentially of permalloy.

7. A magnetoresistive sensor as in claim 1 wherein the spacer layers consist essentially of copper.

8. A magnetoresistive sensor as in claim 1 wherein each of the ferromagnetic layers has a magnetic anisotropy different from the magnetic anisotropies of the other ferromagnetic layers.

9. A magnetoresistive sensor as in claim 1 wherein the antiferromagnetic coupling field strength of any pair of neighboring ferromagnetic layers is different from the antiferromagnetic coupling field strength of all other pairs of neighboring ferromagnetic layers.

10. A magnetoresistive sensor as in claim 1 wherein each of the spacer layers has a thickness different from the thicknesses of the other spacer layers.

11. A magnetoresistive sensor as in claim 1 further comprising a bias layer in contact with the ferromagnetic layer nearest or farthest from the substrate for fixing the magnetization of said nearest or farthest ferromagnetic layer.

12. A magnetoresistive sensor as in claim 1 further comprising a sensing circuit for converting the electrical resistance of the sensor to a voltage signal.

13. A magnetoresistive sensor comprising:

a substrate having an essentially single crystalline face;

a seed layer formed on the crystalline face of the substrate: and a multilayer stack of alternating permalloy layers and copper spacer layers formed on the seed layer, the stack having at least three of the permalloy layers and two of the copper spacer layers with neighboring permalloy layers being antiferromagnetically coupled to one another across an intermediate copper spacer layer, wherein each of the permalloy layers has its magnetic moment aligned antiparallel to the magnetic moment of a neighboring permalloy layer in the absence of an external magnetic field, and wherein each of the permalloy layers has a substantially uniaxial magnetic anisotropy different from the magnetic anisotropies of the other permalloy layers;

whereby the magnetic moment of each permalloy layer is switchable from said antiparallel alignment to parallel alignment at an external magnetic field strength that is different from the magnetic field strength at which the magnetic moments of the other permalloy layers are switchable, the sensor thereby exhibiting discrete steps of decreasing electrical resistance in response to an increasing external magnetic field.

14. A magnetoresistive sensor as in claim 13 wherein the substrate has a 110 crystalline face.

15. A magnetoresistive sensor as in claim 14 wherein the substrate is MgO.

16. A magnetoresistive sensor as in claim 13 wherein the seed layer comprises a first film of iron formed directly on the substrate and a second film of platinum formed directly on the iron film.

17. A magnetoresistive sensor as in claim 13 further comprising a bias layer in contact with the ferromagnetic layer either nearest or farthest from the substrate for fixing the magnetization of said nearest or farthest ferromagnetic layer.

18. A magnetoresistive sensor as in claim 13 further comprising a sensing circuit for converting the electrical resistance of the sensor to a voltage signal.

* * * * *